(12) United States Patent
Sen et al.

(10) Patent No.: US 10,742,180 B2
(45) Date of Patent: Aug. 11, 2020

(54) CLASS-S RF TRANSMITTER FOR MRI SCANNERS

(71) Applicant: ASELSAN ELEKTRONIK SANAYI VE TICARET ANONIM SIRKETI, Ankara (TR)

(72) Inventors: Bulent Sen, Ankara (TR); Filiz Ece Filci, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 218 days.

(21) Appl. No.: 16/087,101

(22) PCT Filed: Jun. 30, 2016

(86) PCT No.: PCT/TR2016/050205
§ 371 (c)(1),
(2) Date: Sep. 21, 2018

(87) PCT Pub. No.: WO2018/004480
PCT Pub. Date: Jan. 4, 2018

(65) Prior Publication Data
US 2019/0103844 A1    Apr. 4, 2019

(51) Int. Cl.
*H03F 3/217* (2006.01)
*H03F 1/02* (2006.01)
*H03F 3/24* (2006.01)

(52) U.S. Cl.
CPC ......... *H03F 3/2175* (2013.01); *H03F 1/0227* (2013.01); *H03F 3/217* (2013.01);
(Continued)

(58) Field of Classification Search
None
See application file for complete search history.

(56) References Cited

U.S. PATENT DOCUMENTS

2012/0275493 A1* 11/2012 Fortier ............... H03F 3/217
                                                375/219
2015/0222461 A1*  8/2015 Motoi ................ H03F 3/24
                                                375/295

FOREIGN PATENT DOCUMENTS

EP          2755323 A1    7/2014

OTHER PUBLICATIONS

Saari V et al:"13.5 MHz class-S modulator for an EER transmitter" Norchip Conference, 2004. Proceedings Oslo, Norway Nov. 8-9, 2004, Piscataway, NJ, USA,IEEE, Nov. 8, 2004 (Nov. 8, 2004), pp. 253-256, XP032364834, DOI: 10.1109/NORCHP.2004.1423871 ISBN: 978-0-7803-8510-8 the whole document.

* cited by examiner

*Primary Examiner* — Paresh Patel
(74) *Attorney, Agent, or Firm* — Bayramoglu Law Offices LLC

(57) ABSTRACT

An analog input signal ($X_{(n)}$) is processed by a Peak to Average Ratio Reduction (PARR) block to diminish the difference between peak amplitudes and average amplitudes of the analog input signal ($X_{(n)}$). After, a distorted signal (h(n)) having low peak to average amplitude ratio, generated at the PARR block output, is processed by a delta sigma modulation (DSM) block converts the distorted signal (h(n)) into a digitally modulated distorted signal ($h\_dsm_{(n)}$) with high signal to noise ratio (SNR). Afterwards, the digitally modulated distorted signal ($h\_dsm_{(n)}$) is corrected and amplified by a Class-D RF power amplifier fed by a feeding signal ($env_{(n)}$) generated from a digital correction signal ($z\_dsm_{(n)}$). As a result, a digitally modulated signal (y(n)) with high signal to noise ratio (SNR) of the analog input signal ($X_{(n)}$) is generated at the output of the Class-D RF power amplifier.

4 Claims, 7 Drawing Sheets

(52) U.S. Cl.
CPC ......... *H03F 3/24* (2013.01); *H03F 2200/102* (2013.01); *H03F 2200/331* (2013.01); *H03F 2200/451* (2013.01)

CLASS-S RF TRANSMITTER FOR MRI SCANNERS

CROSS REFERENCE TO RELATED APPLICATIONS

This application is the national phase entry of International Application No. PCT/TR2016/050205, filed on Jun. 30, 2016, the entire contents of which is incorporated herein by reference.

TECHNICAL FIELD

The present invention is related with Class-S RF transmitter for Magnetic Resonance Imaging (MRI) scanners. The Class-S RF transmitter decreases the peak to average amplitude variation of the analog input signal. Thereby, the input signal is sampled efficiently at all amplitude values and the performance of the Delta Sigma Modulation (DSM) Block, responsible for analog to digital conversion of the input signal, is increased that a higher SNR and better signal linearity are acquired.

BACKGROUND

Magnetic resonance imaging (MRI) scanners use a magnetic field and pulses of radio wave energy to create image of organs and structures inside of a body. A conventional MRI scanner comprises RF transmitters which are all operated on the basis of amplification of an analog input signal with only one high power RF power amplifier. RF transmitters of conventional MRI scanners are illustrated in FIG. 1. However studies are progressing to make a multi-channel, all-digital RF transmitter for new generation MRI scanners. Via new generation multi-channel MRI RF transmitter with digital modulation method, each transmitter channel can be reconfigured individually. Thereby, many parameters like signal type, frequency of operation, phase and amplitude information for RF shimming can be changed easily from a control computer. High image quality with RF shimming capability is expected to be achieved with new generation MRI multi-channel RF transmitters. For this purpose, the RF transmitters of the new generation MRI scanners must be multi-channel, able to generate and transmit RF signals digitally, use digital RF power amplifiers (Switch Mode Power Amplifiers). An exemplified new generation multi-channel RF transmitter block diagram is illustrated in FIG. 2.

Due to its high efficiency performance, one of the preferred digital RF transmitter architecture for new generation MRI scanners is Class-S RF transmitters. In a conventional Class-S RF transmitter, the input signal is converted into a digital signal with constant amplitude by DSM or any other Analog Digital Converter (ADC) and the digital signal is amplified by a switch mode power amplifier. The amplitude information of analog Sinc signal varying in amplitude is transmitted into pulse width in time domain by DSM. Thus a digital signal, pulse width of which is representing the amplitude information of the analog signal, without varying amplitude is achieved. Afterwards, the analog signal is converted into digital modulated signal at RF carrier frequency by multiplying the RF carrier clock signal. After, the digital modulated signal at the carrier frequency is amplified by a power amplifier and converted into analog signal by a band pass filter. So, an analog amplified signal at desired RF frequency is achieved and the said signal can be radiated by MRI antenna in order for medical imaging. An exemplified Class-S RF transmitter block diagram is illustrated in FIG. 2. However, the Class-S RF transmitters have a critical disadvantage that to achieve high linearity there is a necessity to keep the Delta Sigma Modulation (DSM) sampling frequency signal applied to the input of the Class-S RF transmitters high. By this way, the quality of the signal applied to the input is maintained at the output of the Class-S RF transmitter. Nevertheless, switching the Class-D RF power amplifier, inside the Class-S RF transmitter architecture, at high frequency not only decreases the efficiency but also necessitates the RF power amplifier to be wide band, because the more the switching frequency, the wider the frequency band. Chaotically, using wide band architecture for Class-D RF power amplifier leads to decrease the efficiency (total signal power to desired signal power ratio is high) and signal linearity. On the other hand, as aforementioned, low sampling frequency of the DSM signal applied to the input of the Class-D RF power amplifier leads to a corruption in the DSM signal frequency at the output of the Class-D RF power amplifier.

One of the main parameters that affect the performance of MRI scanners is the signal quality. The above described transmitters use only one bit signal having a low SNR rather than multibit signals. Moreover, the DSM used in the conventional Class-S RF transmitters (FIG. 2) has the best efficiency for constant amplitude (non-varying) signal. For said signal, low amplitude values according to peak value in the input signal are poorly sampled. Therefore, while the peak to average ratio value of the signal increases, the SNR decreases and total signal power to desired signal power ratio value in the DSM signal spectrum increases. To increase the SNR, multibit DSM structures can be used but with the said structures constant amplitude signal cannot be generated at the output. Since digital amplification cannot be applied to non-constant amplitude signal, the efficiency decreases. As a result of the above mentioned deficiencies, the efficiency advantage of the Class-S RF transmitters cannot be used for MRI scanners.

In the state of the art EP2755323A1 publication discloses an RF signal generating circuit that generates, from a digital signal, an RF pulse signal to be radio-transmitted.

In the state of the art Ville Saari et al. "13.5 MHz Class-S Modulator for an EER Transmitter" NORCHIP CONFERENCE, 2004 publication discloses an integrated 13.5MHz class-S modulator for an EER transmitter. The modulator uses 3.3 V supply voltage and was fabricated using 0.18 pm CMOS technology.

In the present invention, peak to average amplitude ratio of the input signal is decreased. Thereby, the input signal can be sampled efficiently at all amplitude values.

BRIEF DESCRIPTION OF THE DRAWINGS

An exemplary embodiment of the present invention is illustrated by way of example in the accompanying drawings to be more easily understood and uses thereof will be more readily apparent when considered in view of the detailed description, in which like reference numbers indicate the same or similar elements, and the following figures in which.

DETAILED DESCRIPTION OF THE EMBODIMENTS

The present invention is related to Class-S RF transmitter for Magnetic Resonance Imaging (MRI) scanners. The Class-S RF transmitter decreases the peak to average amplitude variation of the analog input signal. Thereby, the input signal is sampled efficiently at all amplitude values and Delta Sigma Modulation (DSM) Block performance is increased that a higher SNR and better signal linearity are acquired.

In the present invention, an analog input signal ($X_{(n)}$) is processed by a Peak to Average Ratio Reduction (PARR) block to diminish the difference between peak amplitudes and average amplitudes of the analog input signal ($X_{(n)}$). After a distorted signal ($h_{(n)}$), having low peak to average amplitude ratio, generated at the PARR block output, is processed by a delta sigma modulation (DSM) block converting the distorted signal ($h_{(n)}$) into a digitally modulated distorted signal ($h\_dsm_{(n)}$) with high signal to noise ratio (SNR). Afterwards, the digitally modulated distorted signal ($h\_dsm_{(n)}$) is corrected and amplified by a Class-D RF power amplifier fed from a dynamic supply modulator by a feeding signal ($env_{(n)}$) generated from a digital correction signal ($z\_dsm_{(n)}$). As a result, a digitally modulated signal ($y_{(n)}$) with high signal to noise ratio (SNR) of the analog input signal ($X_{(n)}$) is generated at the output of the Class-D RF power amplifier.

Figure 1:
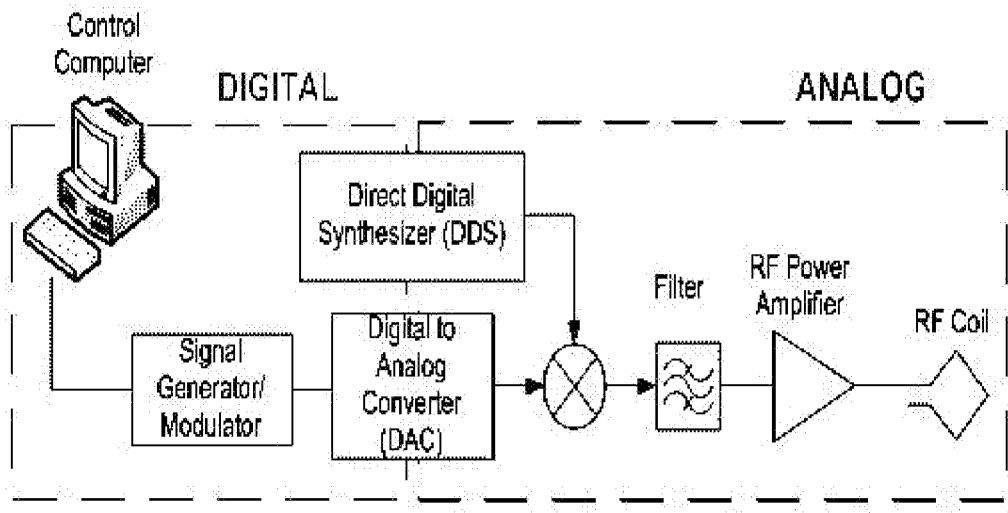
FIG. 1. A prior art basic block diagram of a conventional transmitter for MRI scanners.
Figure 2:
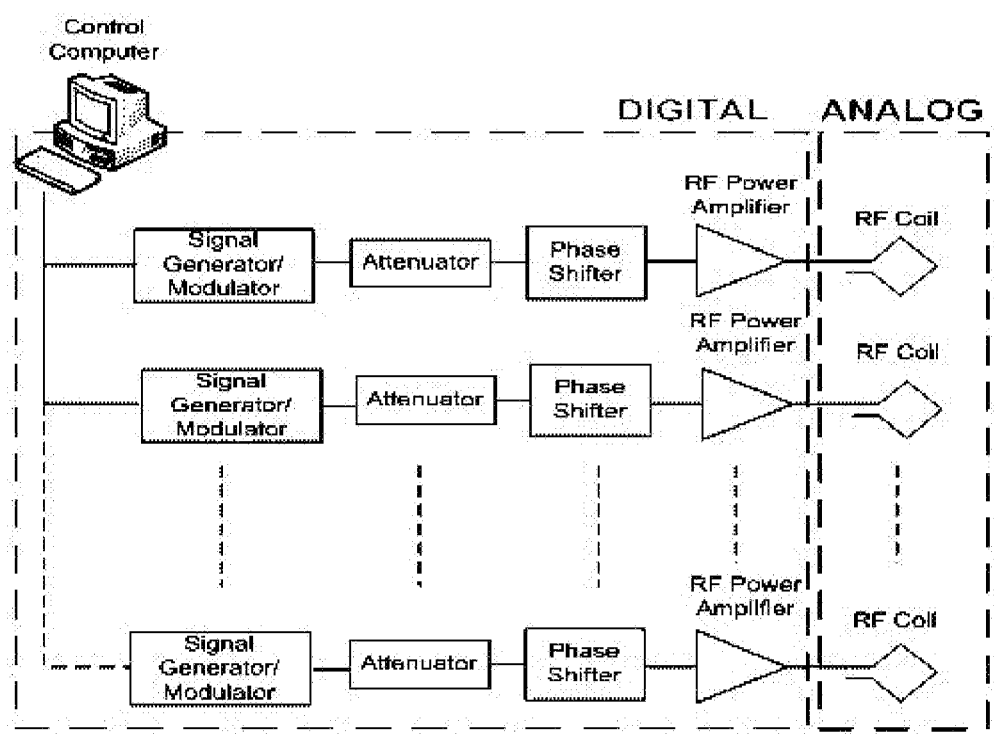
FIG. 2. A prior art basic block diagram of new generation multi-channel, all-digital RF transmitter for MRI scanners.
Figure 3:
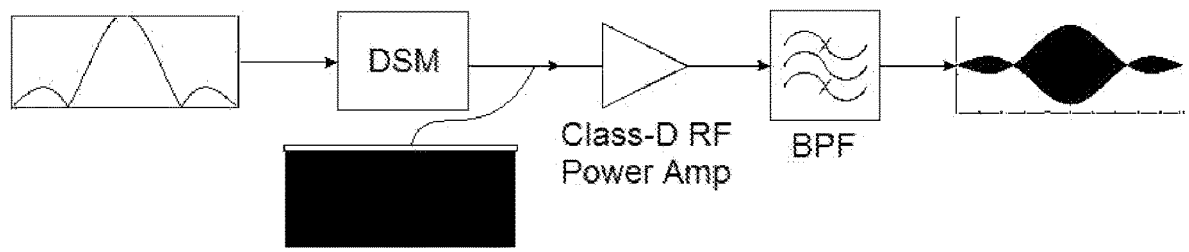
FIG. 3. A prior art basic block diagram of DSM based Class-S RF transmitter for MRI scanners.
Figure 4:
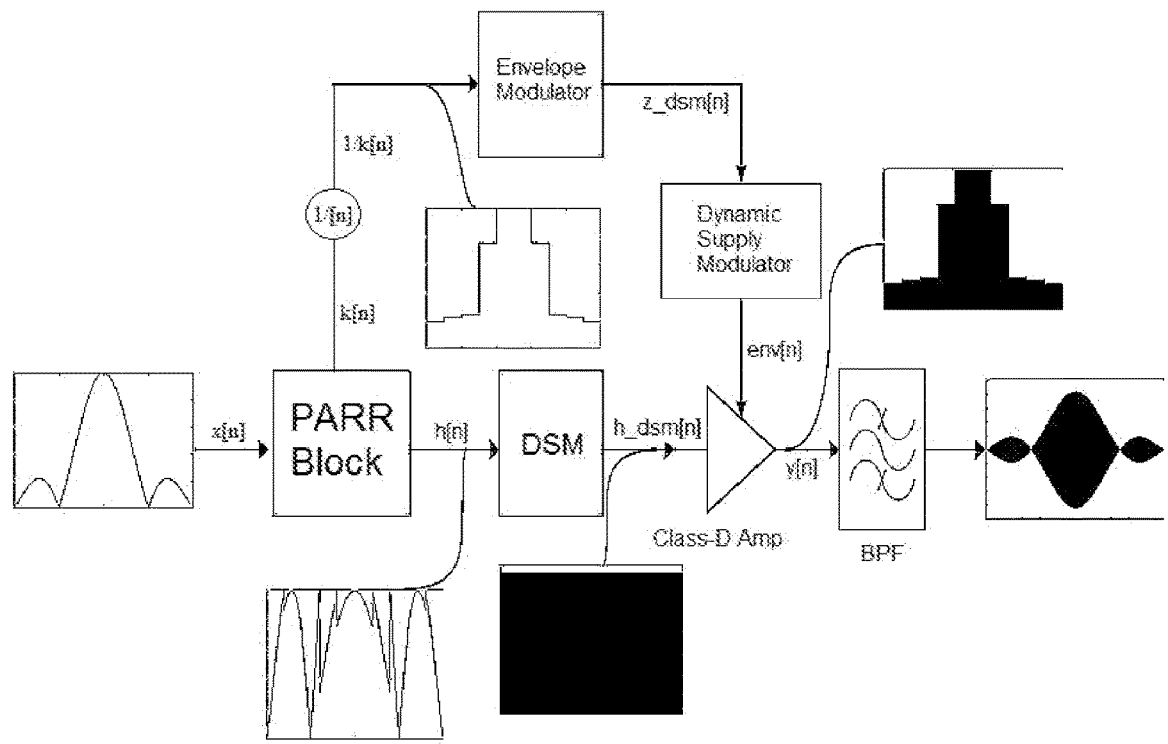
FIG. 4. Basic block diagram of one embodiment of Class-S RF transmitter for Magnetic Resonance Imaging (MRI) scanners.
Figure 5:
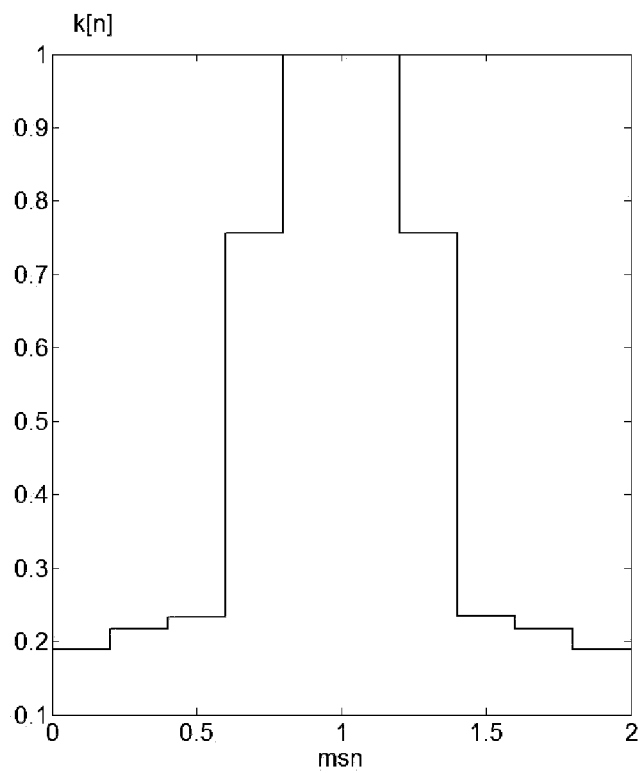
FIG. 5. An exemplary illustration of a distortion function for 2 ms Sinc signal.
Figure 6:
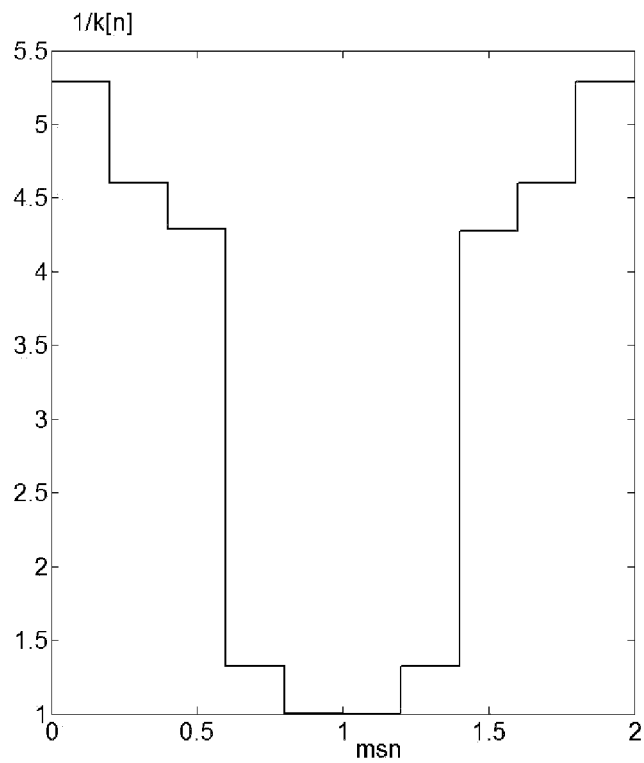
FIG. 6. An exemplary illustration of a correction function for 2 ms Sinc signal.
Figure 7:
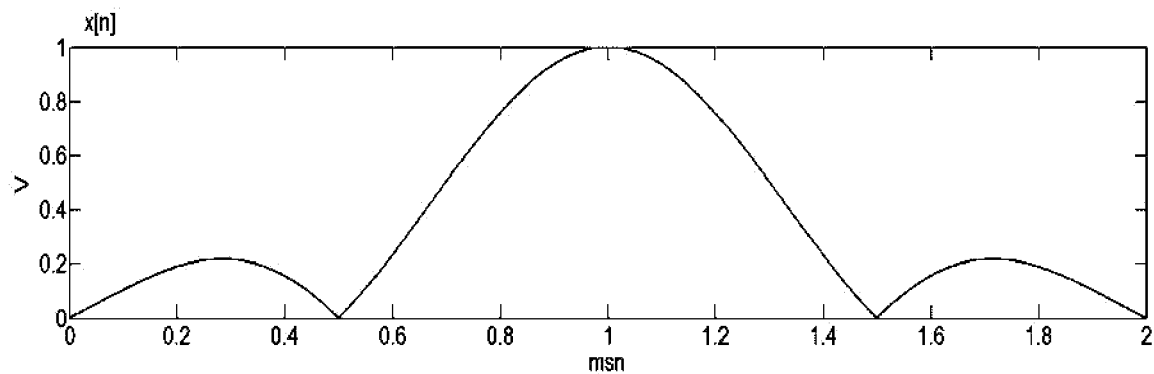
FIG. 7. An exemplary illustration of an analog input signal for 2 ms Sinc signal.
Figure 8:
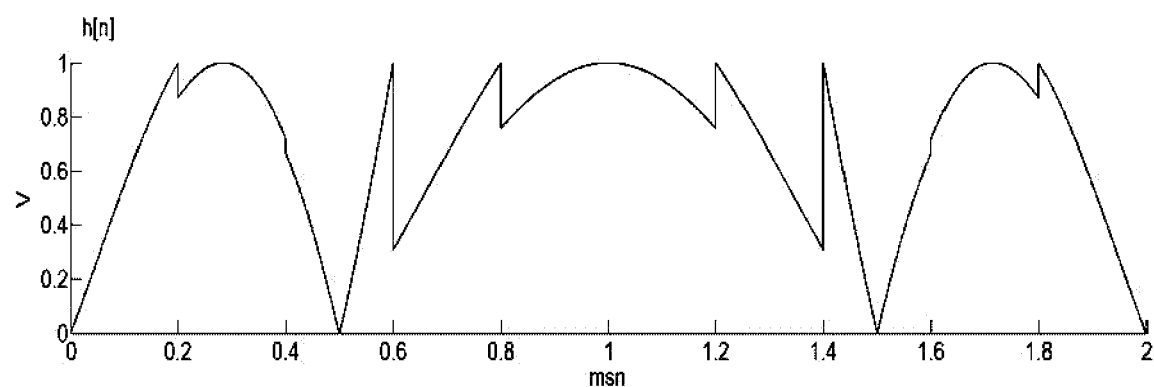
FIG. 8. An exemplary illustration of a distorted signal (reduced peak to average amplitude variation signal) of 2 ms analog input Sinc signal.
Figure 9:
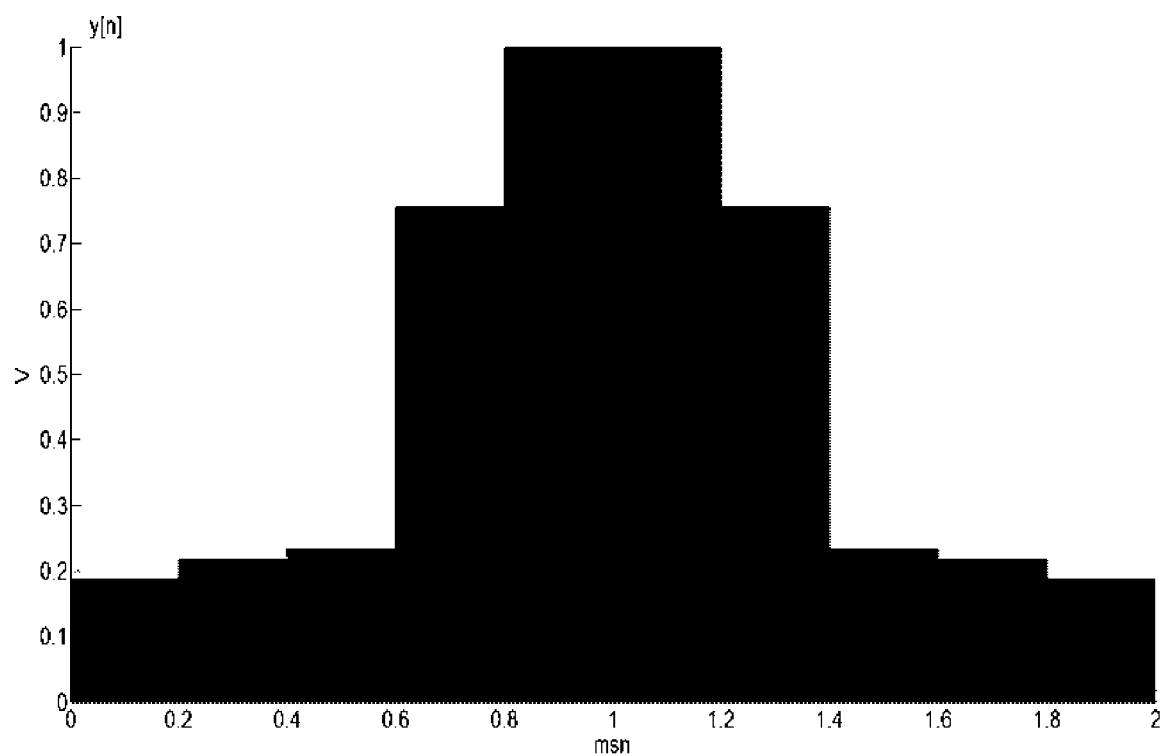
FIG. 9. An exemplary illustration of digitally modulated signal with high signal to noise ratio (SNR) of an analog input signal at the Class-D RF power amplifier.
Figure 10:
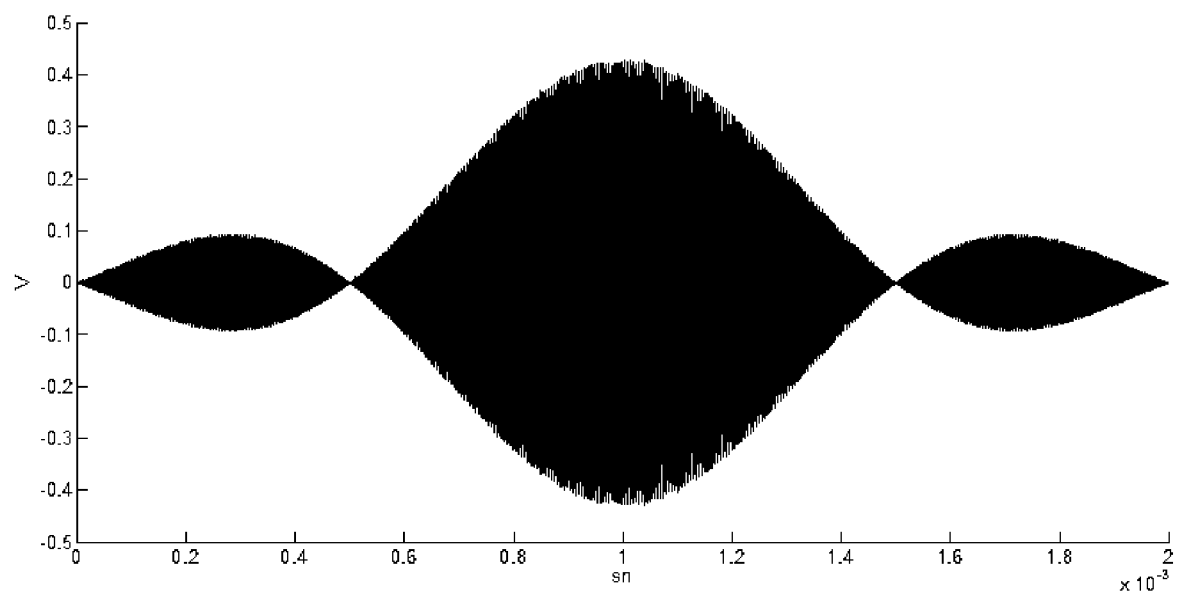
FIG. 10. An exemplary illustration of a RF signal at a band pass filter output.

In the Class-S RF transmitter for MRI scanners, an analog input signal ($X_{(n)}$) is applied to a Peak to Average Ratio Reduction (PARR) block having at least a first output and a second output. In PARR block the analog input signal ($X_{(n)}$) is split into sections in equal time intervals ($t_0$). Preferably, the time interval ($t_0$) is selected according to sampling frequency ($f_{sw}$) of the PARR block. A distortion coefficient ($k_{(m)}$) for each section is calculated by dividing the maximum signal value (amplitude value) of each sections into the maximum signal value of the analog input signal ($X_{(n)}$). Afterwards, each section is divided into corresponding distortion coefficient ($k_{(m)}$) and combined together to obtain a distorted signal ($h_{(n)}$) which is the analog input signal ($X_{(n)}$) peak to average amplitude ratio value of which is reduced. Dividing a section into corresponding distortion coefficient ($k_{(m)}$) amplifies the each section. Technically, the maximum amplitude value of the section is equalized to the maximum amplitude value of the analog input signal ($X_{(n)}$) [see FIG. 7, 8]. The combination of each amplified section is the analog input signal ($X_{(n)}$) low amplitude of which is amplified.

In another embodiment of the invention, the distortion coefficient ($k_{(m)}$) for each section is calculated by dividing the maximum signal value of the analog input signal ($X_{(n)}$) into the maximum signal value (amplitude value) of each sections. Afterwards, each section is multiplied by corresponding distortion coefficient ($k_{(m)}$) and combined together to obtain distorted signal ($h_{(n)}$) which is the analog input signal ($X_{(n)}$) peak to average amplitude value of which is reduced. Multiplying a section into corresponding distortion coefficient ($k_{(m)}$) amplifies the each section. Technically, the maximum amplitude value of the section is equalized to the maximum amplitude value of the analog input signal ($X_{(n)}$) [see FIG. 7, 8]. The combination amplified sections is the analog input signal ($X_{(n)}$) low amplitude of which is amplified.

The distorted signal ($h_{(n)}$) is applied to a delta sigma modulation (DSM) block from the first output of the PARR block. The DSM block converts the distorted signal ($h_{(n)}$) into a digitally modulated distorted signal ($h\_dsm_{(n)}$).

In the PARR block, the distortion coefficients ($k_{(m)}$) are transformed into a distortion function ($k_{(n)}$). Afterwards, the multiplicative inverse of the distortion function ($1/k_{(n)}$) is applied to a DSM based envelope modulator from the second output of the PARR block. The DSM based envelope modulator converts the multiplicative inverse of the distortion function ($1/k_{(n)}$) into a correction signal ($z\_dsm_{(n)}$). Thereafter, the correction signal ($z\_dsm_{(n)}$) applied into dynamic supply modulator. Dynamic supply modulator converts the correction signal ($z\_dsm_{(n)}$) into a high power (high voltage and high current) DC feeding signal ($env_{(n)}$).

The digitally modulated distorted signal ($h\_dsm_{(n)}$) is applied to RF input of a Class-D RF power amplifier running in switching mode and the feeding signal ($env_{(n)}$) is applied to DC input of the Class-D RF power amplifier. The Class-D RF power amplifier amplifies and corrects the digitally modulated distorted signal ($h\_dsm_{(n)}$) via the feeding signal ($env_{(n)}$) such that a digitally modulated signal ($y_{(n)}$) with high signal to noise ratio (SNR) of the analog input signal ($X_{(n)}$) is generated at the output of the Class-D RF power amplifier.

Now, the generated digitally modulated signal ($y_{(n)}$) can be converted into an amplified Sinc signal at the RF carrier frequency by a band pass filter. Thus, more linear Sinc signal with high efficiency is obtained at the Class-S RF transmitter output.

Figure 11:
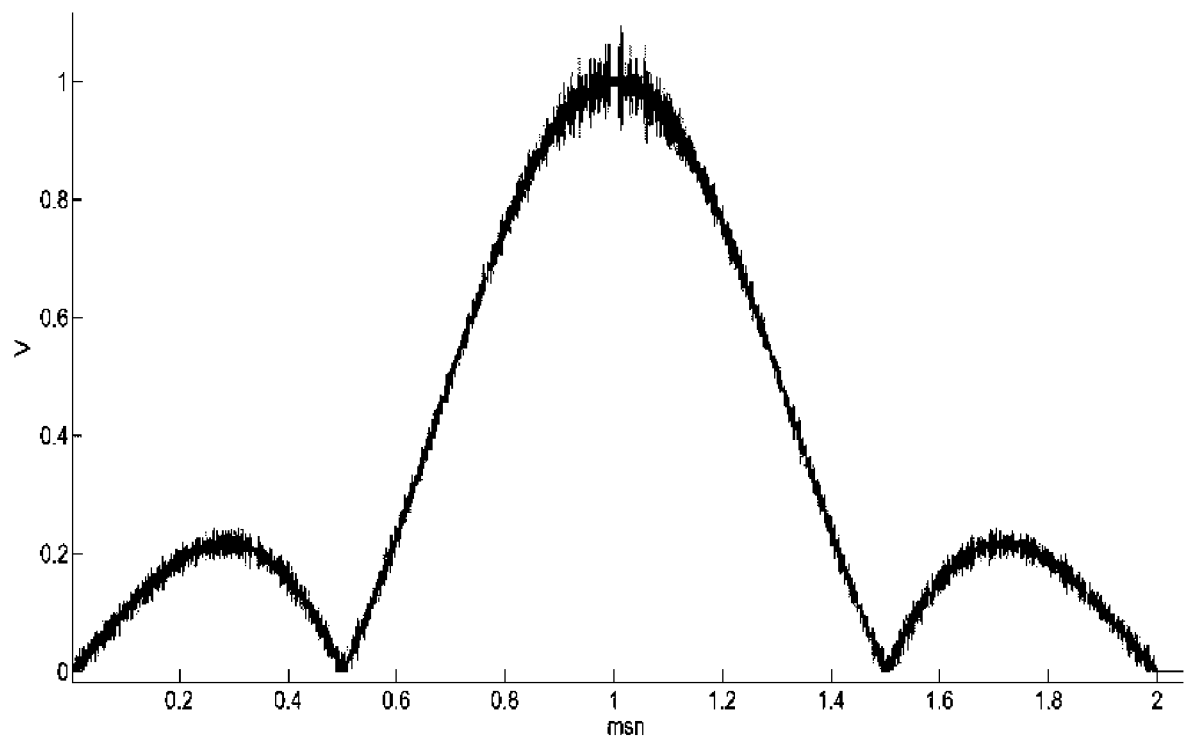
FIG. 11. An exemplary illustration of an envelope signal of a RF Sinc signal not applied to the Peak to Average Ratio Reduction process at a band pass filter output.
Figure 12:
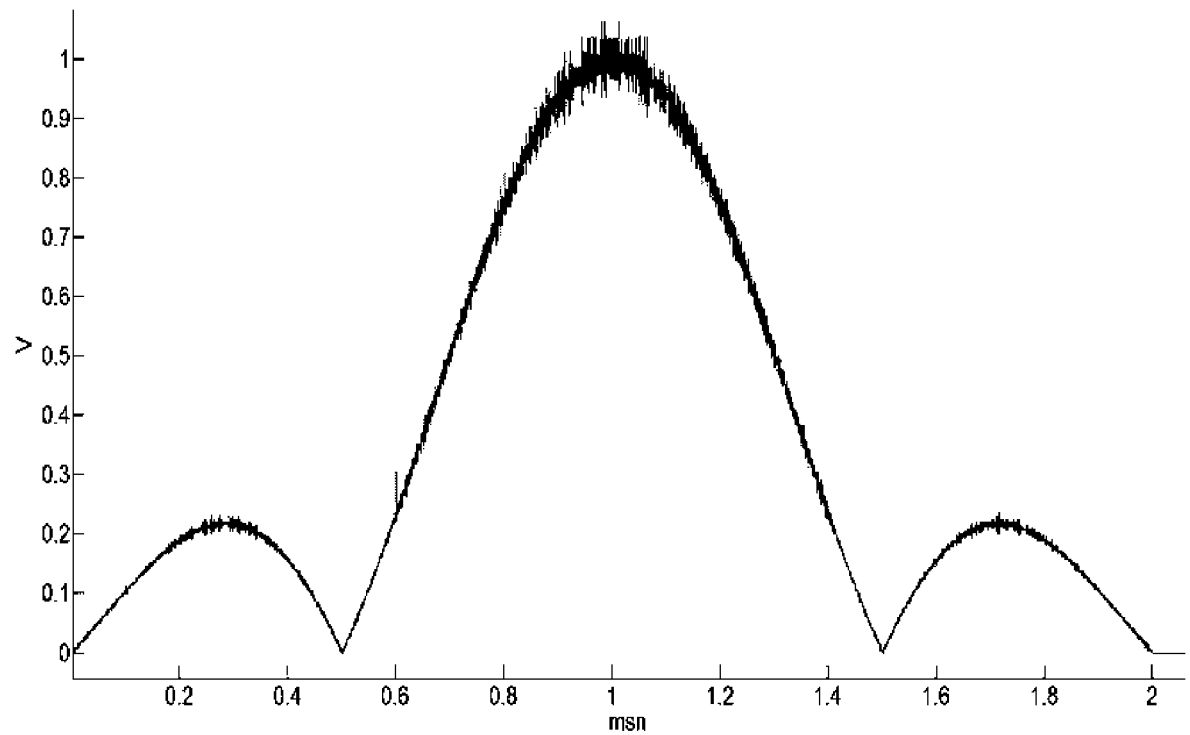
FIG. 12. An exemplary illustration of an envelope signal of a RF Sinc signal applied to the Peak to Average Ratio Reduction process at a band pass filter output.

It is illustrated that an envelope signal of a RF Sinc signal not applied to the Peak to Average Ratio Reduction process at a band pass filter output in FIG. 11 and an envelope signal of a RF Sinc signal applied to the Peak to Average Ratio Reduction process at a band pass filter output in FIG. 12 (the band width of the band pass filter at the output of the Class-S RF transmitter is 1 MHz). It is clearly seen in the figures that the low amplitude areas of the signal are recovered with a lower noise in the FIG. 12 rather than FIG. 11.

Figure 13:
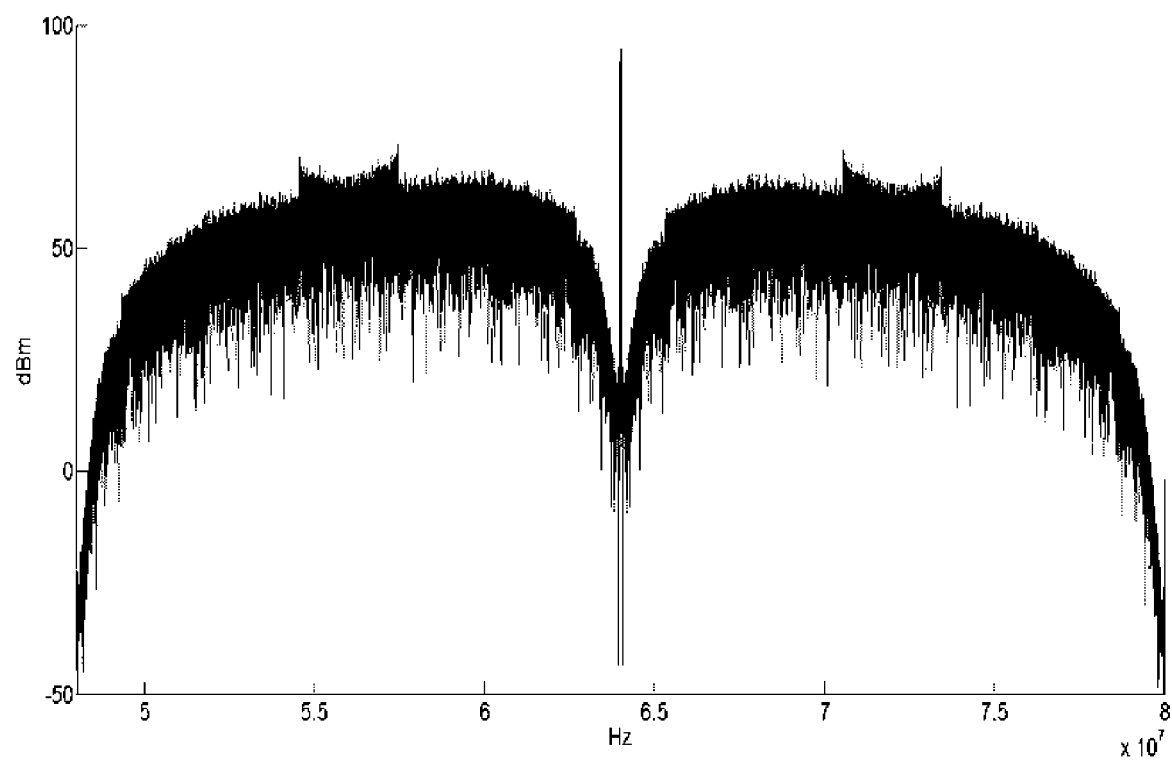
FIG. 13. An exemplary illustration of a frequency spectrum of a RF Sinc signal not applied to the Peak to Average Ratio Reduction process at Class-S RF transmitter output.
Figure 14:
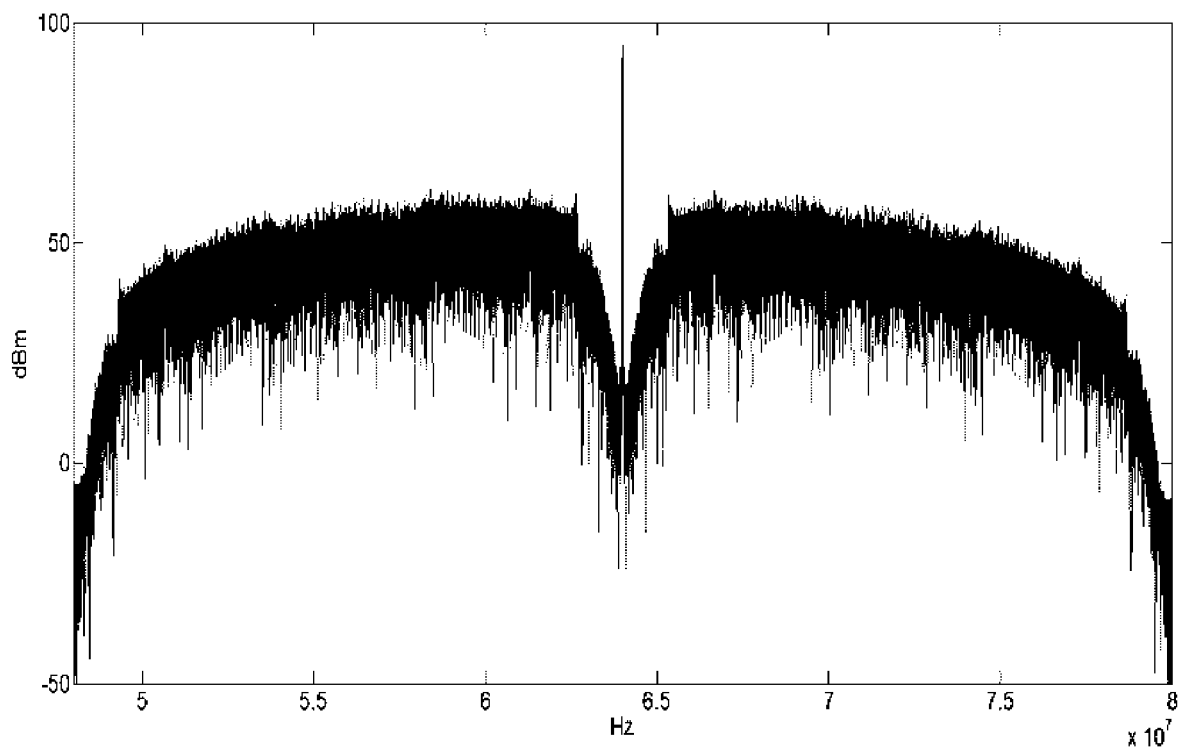
FIG. 14. An exemplary illustration of a frequency spectrum of a RF Sinc signal applied to the Peak to Average Ratio Reduction process at Class-S RF transmitter output.

It is illustrated that a frequency spectrum of a RF Sinc signal not applied to the Peak to Average Ratio Reduction process at Class-S RF transmitter output in FIG. 13 and frequency spectrum of a RF Sinc signal applied to the Peak to Average Ratio Reduction process at Class-S RF transmitter output in FIG. 14. It is clearly seen in the spectrums that the noise level of the signal in and out of the signal band is lower in the FIG. 12 rather than FIG. 11.

The functional representation of the Class-S RF transmitter method is disclosed below;

$$[h[n], 1/k[n]] = f_{PARR}[x[n]]$$

$$k[m] = \frac{\max(x[n:n+k_0])}{\max(x[n])}, m = 0, \ldots, \frac{N}{k_0}, k_0 = \frac{N}{T \times f_{sw}}, f_{sw} = \frac{1}{t_0}$$

$$k[n] = upsample(k[m], k_0)$$

$$f_{dsm\_env} = \frac{1-z^{-1}}{(1-z^{-1}) + \frac{1}{(1-z^{-1})} + 2} \times \left(\frac{z}{z+1}\right)^2$$

$$z_{dsm[n]} = f_{dsm\_env} \otimes \left(\frac{1}{k[n]}\right)$$

$$env[n] = z_{dsm[n]} \times V_{dd}$$

$$f_{dsm\_RF} = \frac{1-z^{-1}}{(1-z^{-1}) + \frac{1}{(1-z^{-1})} + 2} \times \left(\frac{z}{z+1}\right)^2$$

$$h[n] = x[n] \times k[n]$$

$$h\_dsm[n] = f_{dsm\_RF} \otimes h[n]$$

$$y[n] = A \times h\_dsm[n] \times env[n]$$

Nomenclature x[n]: Analog input signal $x[n]=x(t=nt_0)$, n=0, ..., N, t=0, ..., T
h[n]: Distorted signal
k[n]: Distortion coefficient
$f_{PAR}$: Peak to Average Ratio Reduction (PARR) block function
A: Power amplifier gain
$V_{dd}$: Voltage Drain Drain
T: Input signal pulse duration
N: Input signal sampling number
$f_{dsm\_env}$: DSM based envelope modulator function
$z_{dsm[n]}$: Correction signal
env[n]: Feeding signal
y[n]: Digitally modulated signal (y(n)) with high signal to noise ratio (SNR) of the analog input signal (X(n))
h_dsm[n]: Digitally modulated distorted signal
$f_{dsm\_RF}$: DSM block function
$f_{sw}$: Sampling frequency The foregoing embodiments are merely descriptions on preferred implementations of the present invention, rather than limitations to the concept and scope of the present invention. Various variations and improvements made by a person of ordinary skill in the art on the technical solutions of the present invention without departing from the design concept of the present invention shall all fall within the protection scope of the present invention. The technical contents claimed by the present invention are all recorded in the claims.

What is claimed is:

1. A class-S RF transmitter for Magnetic Resonance Imaging (MRI) scanners comprising:
a Peak to Average Ratio Reduction (PARR) block having at least a first output and a second output where an analog input signal is split into a plurality of sections in equal time intervals, a distortion coefficient for each section is calculated by dividing a maximum signal value of the each section into a maximum signal value of the analog input signal, the each section is divided into the corresponding distortion coefficient and combined together to obtain a distorted signal, where the distortion coefficients are transformed into a distortion function;
a delta sigma modulation (DSM) block converting the distorted signal, fed from the first output, into a digitally modulated distorted signal;
a DSM based envelope modulator converting a multiplicative inverse of the distortion function, fed from the second output, into a correction signal;
a dynamic supply modulator converting the correction signal into a DC feeding signal; and
a class-D RF power amplifier having at least an RF input and a DC input, wherein the digitally modulated distorted signal is applied to the RF input and the feeding signal is applied to the DC input, amplifying the digitally modulated distorted signal via correcting the amplified digitally modulated distorted signal with the feeding signal, and generating a digitally modulated signal having a high signal to noise ratio.

2. A class-S RF transmitter for Magnetic Resonance Imaging (MRI) scanners comprising:
a Peak to Average Ratio Reduction (PARR) block having at least a first output and a second output where an analog input signal is split into a plurality of sections in equal time intervals, a distortion coefficient for each section is calculated by dividing a maximum signal value of the analog input signal into a maximum signal value of the each section, the each section is multiplied into the corresponding distortion coefficient and combined together to obtain a distorted signal, where the distortion coefficients are transformed into a distortion function;
a delta sigma modulation (DSM) block converting the distorted signal, fed from the first output, into a digitally modulated distorted signal;
a DSM based envelope modulator converting the multiplicative inverse of the distortion function, fed from the second output, into a correction signal;
a dynamic supply modulator converting the correction signal into a feeding signal; and
a Class-D RF power amplifier having at least a RF input and a DC input, wherein the digitally modulated distorted signal is applied to the RF input and the feeding signal is applied to the DC input, amplifying the digitally modulated distorted signal via correcting the amplified digitally modulated distorted signal with the feeding signal generating a digitally modulated signal, having a high signal to noise ratio.

3. A method for carrying out the class-S RF transmitter for Magnetic Resonance Imaging (MRI) scanners as in claim 1, the method comprising the steps of:
splitting an analog input signal into sections in equal time intervals by a Peak to Average Ratio Reduction (PARR) block having at least a first output and a second output;
calculating a distortion coefficient for each section by dividing a maximum signal value of each section into a maximum signal value of the analog input signal;
dividing each section into corresponding distortion coefficient;

combining each divided section to obtain a distorted signal;

transforming the distortion coefficients into a distortion function;

converting the distorted signal, fed from the first output, into a digitally modulated distorted signal by a delta sigma modulation (DSM) block;

converting a multiplicative inverse of the distortion function, fed from the second output, into a correction signal by a DSM based envelope modulator;

converting the correction signal into a feeding signal by a dynamic supply modulator;

amplifying the digitally modulated distorted signal by a class-D RF power amplifier which the digitally modulated distorted signal is applied to an RF input of class-D RF amplifier; and generating a digitally modulated signal having a high signal to noise ratio via correcting the amplified digitally modulated distorted signal with the feeding signal by the class-D RF power amplifier which the feeding signal is applied to a DC input of the class-D RF power amplifier.

4. A method for carrying out the class-S RF transmitter for Magnetic Resonance Imaging (MRI) scanners as in claim 2 comprising the steps of:

splitting an analog input signal into sections in equal time intervals by a Peak to Average Ratio Reduction (PARR) block having at least a first output and a second output;

calculating a distortion coefficient for each section by dividing a maximum signal value of the analog input signal into a maximum signal value of the each section;

multiplying the each section into corresponding distortion coefficient;

combining each divided section to obtain a distorted signal;

transforming the distortion coefficients into a distortion function;

converting the distorted signal, fed from the first output, into a digitally modulated distorted signal by a delta sigma modulation (DSM) block;

converting the multiplicative inverse of the distortion function, fed from the second output, into a correction signal by a DSM based envelope modulator;

converting the correction signal into a feeding signal by a dynamic supply modulator;

amplifying the digitally modulated distorted signal by a class-D RF power amplifier wherein the digitally modulated distorted signal is applied to an RF input of the class-D RF amplifier; and generating a digitally modulated signal having a high signal to noise ratio via correcting the amplified digitally modulated distorted signal with the feeding signal by the class-D RF power amplifier wherein the feeding signal is applied to a DC input of the class-D RF amplifier.

* * * * *